(12) United States Patent
Gektin et al.

(10) Patent No.: US 7,939,364 B2
(45) Date of Patent: May 10, 2011

(54) OPTIMIZED LID ATTACH PROCESS FOR THERMAL MANAGEMENT AND MULTI-SURFACE COMPLIANT HEAT REMOVAL

(75) Inventors: Vadim Gektin, San Jose, CA (US); Deviprasad Malladi, Freemont, CA (US)

(73) Assignee: Oracle America, Inc., Redwood City, CA (US)

( * ) Notice: Subject to any disclaimer, the term of this patent is extended or adjusted under 35 U.S.C. 154(b) by 372 days.

(21) Appl. No.: 12/121,337

(22) Filed: May 15, 2008

(65) Prior Publication Data

US 2009/0286359 A1    Nov. 19, 2009

(51) Int. Cl.
    *H01L 21/00*    (2006.01)
(52) U.S. Cl. ... 438/95; 438/106; 438/108; 257/E21.077; 257/E21.499; 257/E21.502; 257/E21.511
(58) Field of Classification Search .......... 438/95, 438/106, 122, 123, 125, 107, 108; 257/E21.007, 257/499, 502, 511
    See application file for complete search history.

(56) References Cited

U.S. PATENT DOCUMENTS

| | | | |
|---|---|---|---|
| 7,347,354 B2 * | 3/2008 | Hurley et al. | 228/219 |
| 7,473,995 B2 * | 1/2009 | Rumer et al. | 257/707 |
| 2003/0178720 A1 * | 9/2003 | Rumer et al. | 257/715 |
| 2003/0178730 A1 * | 9/2003 | Rumer et al. | 257/778 |
| 2005/0211752 A1 * | 9/2005 | Hurley et al. | 228/245 |

* cited by examiner

*Primary Examiner* — David Nhu
(74) *Attorney, Agent, or Firm* — Osha • Liang LLP

(57) ABSTRACT

A multi-surface compliant heat removal process includes: identifying one or more components to share a heat rejecting device, applying non-adhesive film to the one or more components, identifying a primary component of the one or more components, and applying phase change material on each of the one or more components other than the primary component. The phase change material is placed on top of the non-adhesive film. The process further includes placing the heat rejecting device on the corresponding one or more components and removing the heat rejecting device from the corresponding one or more components. The phase change material and the non-adhesive film remain with the heat rejecting device. The process also includes reflowing the phase change material on the heat rejecting device, removing the non-adhesive film from the heat rejecting device, placing a heatsink-attach thermal interface material on the one or more components, and placing the heat rejecting device on the corresponding one or more components.

7 Claims, 4 Drawing Sheets

OPTIMIZED LID ATTACH PROCESS FOR THERMAL MANAGEMENT AND MULTI-SURFACE COMPLIANT HEAT REMOVAL

BACKGROUND OF INVENTION

The assembly of a semiconductor package plays an important role in thermal management. A conventional semiconductor package includes a lid, one or more die, a die interconnect, a substrate, a substrate interconnect, and lid-attach thermal interface material ("TIM").

The die is placed on the substrate through a die-attach process. Typically, the die-attach process involves attaching a flip-chip type die to the substrate by the die interconnect through a reflow process. The underfill is applied to the die interconnect, the die, and the substrate. The lid-attach TIM is applied to the bottom side of the die (the side opposite the die interconnect). The lid is placed on the substrate, typically making contact with the die by way of the lid-attach TIM. The semiconductor package is cured at a curing temperature. The bond line thickness ("BLT") of the lid-attach TIM is determined by the co-planarity of the die, substrate, and lid, the application of the lid to the substrate, the characteristics of the lid-attach TIM, and the curing process of the assembled semiconductor package.

Conventional techniques for heat removal from a microprocessor, application specific integrated circuit ("ASIC"), integrated circuit ("IC"), or other printed circuit board ("PCB") component rely upon the use of the heatsink-attach TIM placed between the heat generating device and a heat rejecting device. Typically, a single heat rejecting device, i.e., a heatsink, spans several components on the heat generating device, i.e., a semiconductor package. The BLT of the heatsink-attach TIM determines the thermal path performance and cooling efficiency of the heat rejecting device.

SUMMARY OF INVENTION

According to one aspect of one or more embodiments of the present invention, a semiconductor package assembly process comprising: attaching one or more die to a substrate by a die-attach interconnect; raising a temperature of the one or more die to a target temperature; placing a lid-attach thermal interface material on the one or more die upon reaching the target temperature; placing a lid on the substrate to achieve a target bond line thickness of the lid-attach thermal interface material between the one or more die and the lid; and curing the assembled semiconductor package at a curing temperature.

According to one aspect of one or more embodiments of the present invention, a multi-surface compliant heat removal process comprising: identifying one or more components to share a heat rejecting device; applying a non-adhesive film to the one or more components; identifying a primary component of the one or more components; applying a phase change material on each of the one or more components other than the primary component, wherein the phase change material is placed on top of the non-adhesive film; placing the heat rejecting device on the corresponding one or more components; removing the heat rejecting device from the corresponding one or more components, wherein the phase change material and the non-adhesive film remain with the heat rejecting device; reflowing the phase change material on the heat rejecting device; removing the non-adhesive film from the heat rejecting device; placing a heatsink-attach thermal interface material on the one or more components; placing the heat rejecting device on the corresponding one or more components.

BRIEF DESCRIPTION OF DRAWINGS

FIG. 2($b$) is the flattened out flip-chip die with lid-attach TIM applied, the die is die-attached to the substrate and raised to an elevated temperature in accordance with one or more embodiments of the present invention.

FIG. 2($c$) is an assembled semiconductor package in accordance with one or more embodiments of the present invention.

FIG. 4($b$) is the substrate with the primary component, secondary component, non-adhesive film, PCM, and placed heat rejecting device in accordance with one or more embodiments of the present invention.

FIG. 4($c$) is the substrate with the primary component and secondary component, and removed heat rejecting device, PCM, and non-adhesive film in accordance with one or more embodiments of the present invention.

FIG. 4($d$) is the substrate with the primary component, secondary component, and heatsink attach-TIM, and removed heat rejecting device and reflowed PCM in accordance with one or more embodiments of the present invention.

FIG. 4($e$) is the substrate, primary component, secondary component, reflowed PCM, re-placed heat rejecting device, and heatsink-attach TIM in accordance with one or more embodiments of the present invention.

DETAILED DESCRIPTION

Figure 1:
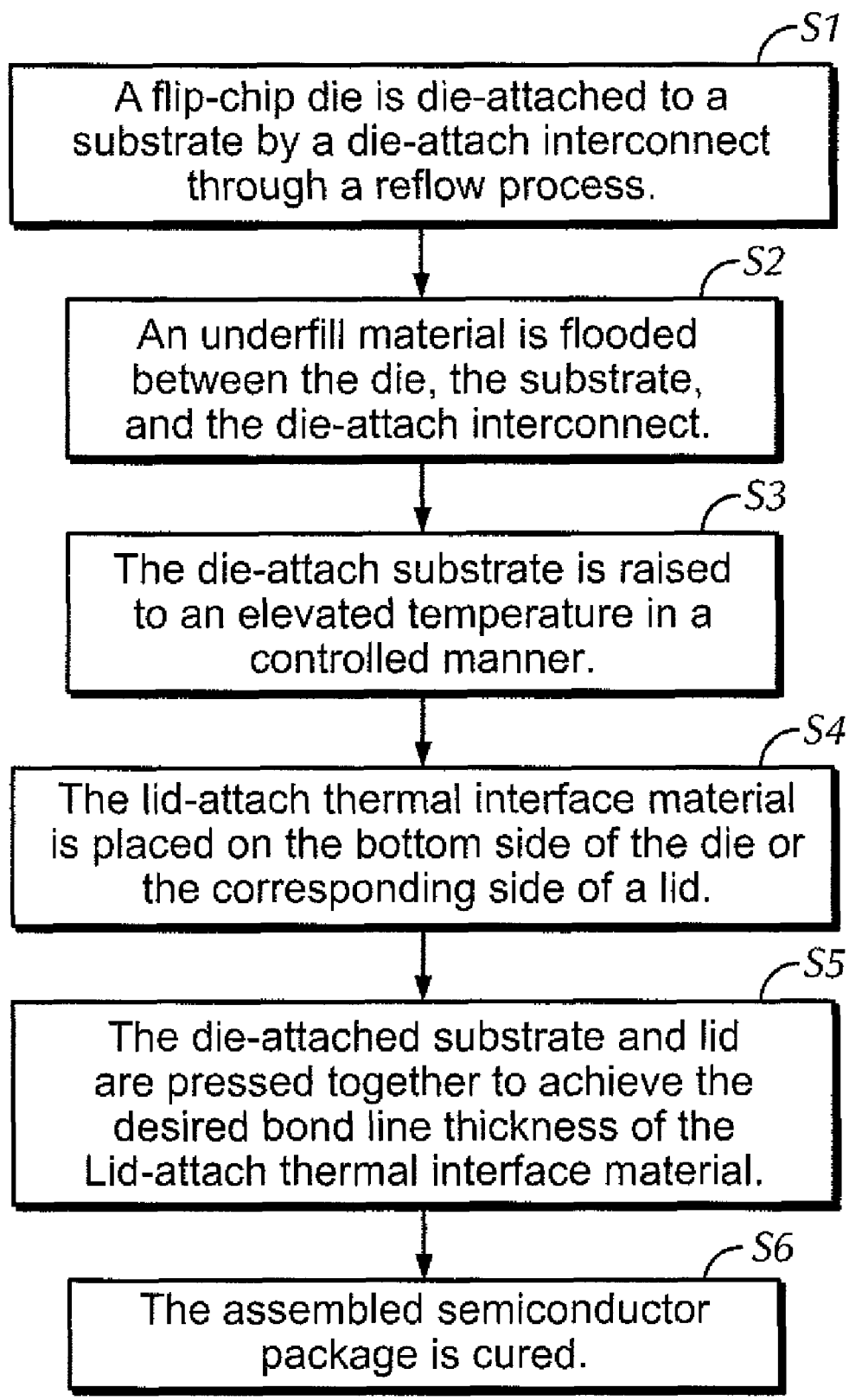
FIG. 1 is a process for assembling a semiconductor package in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1 shows a process for assembling a semiconductor package in accordance with one or more embodiments of the present invention. In S1, a flip-chip die is die-attached to a substrate by a die-attach interconnect through a reflow process. The die-attach interconnect could be a Controlled Collapse Chip Connection, also known as C4, or other die-attach interconnect. One of ordinary skill in the art will recognize that other die-attach interconnects could be used in accordance with one or more embodiments of the present invention. The die and substrate may differ in construction or materials. The die and substrate may differ in their respective coefficient of thermal expansion. The die and substrate may, individually or collectively, exhibit warpage prior to, during, or after the reflow process.

In S2, an underfill material is flooded between the die, the substrate, and the die-attach interconnect. The underfill may be cured separately or concurrently with the lid-attach TIM, depending on the curing temperature profile. In S3, the die-attached substrate is raised to an elevated temperature in a controlled manner. The elevated temperature may be 150 degrees C. or any other temperature in which the die becomes flat or more nearly flat. The elevated temperature may be the curing temperature for the lid-attach TIM. In S4, the lid-attach TIM is placed on the bottom side of the die or the corresponding side of a lid. In S5, the die-attached substrate and lid are pressed together to achieve the desired BLT of the lid-attach TIM. In S6, the assembled semiconductor package is cured at a curing temperate. The curing temperature may be the same temperature utilized in S3 or a different temperature.

Figure 2A:
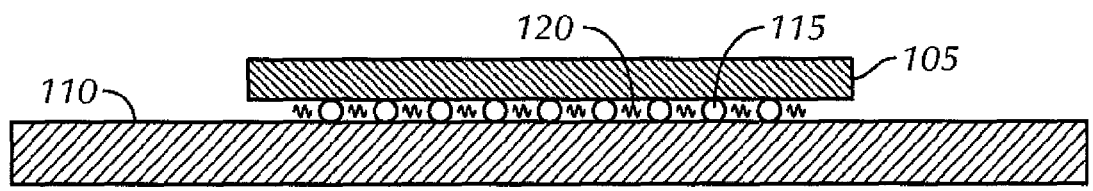
FIG. 2($a$) is a warped flip-chip die that is die-attached to a substrate by a die-attach interconnect after a reflow process in accordance with one or more embodiments of the present invention.

FIG. 2(a) shows a warped flip-chip die 105 that is die-attached to a substrate 110 by a die-attach interconnect 115 after a reflow process in accordance with one or more embodiments of the present invention. An underfill 120 is flooded between the die 105, the substrate 110, and the die-attach interconnect 115. The die 105 and substrate 110 may differ in construction and materials. The die 105 and substrate 110 may differ in their respective coefficient of thermal expansion. The die 105 and substrate 110 may, individually or collectively, exhibit warpage prior to, during, or after the reflow process. The temperature of the die-attached substrate 110 may be raised to an elevated temperature in a controlled manner. The elevated temperature may be 150 degrees C. or any other temperature in which the die 105 becomes flat or more nearly flat.

Figure 2B:
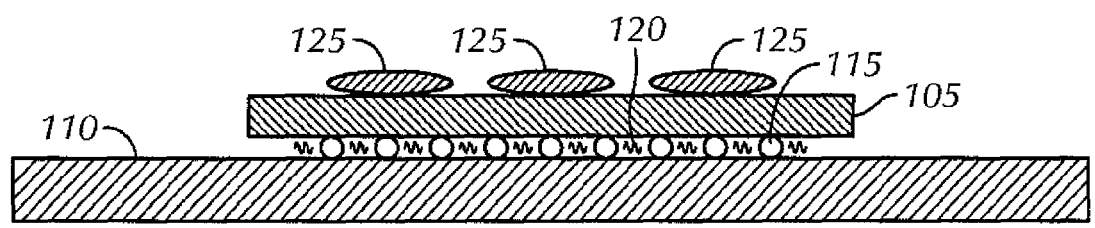

FIG. 2(b) shows the flattened out flip-chip die 105 with lid-attach TIM 125 applied, the die 105 is die-attached to the substrate 110 and raised to an elevated temperature in accordance with one or more embodiments of the present invention. The die 105 may become flat or more nearly flat as a result of being raised to an elevated temperature.

Figure 2C:
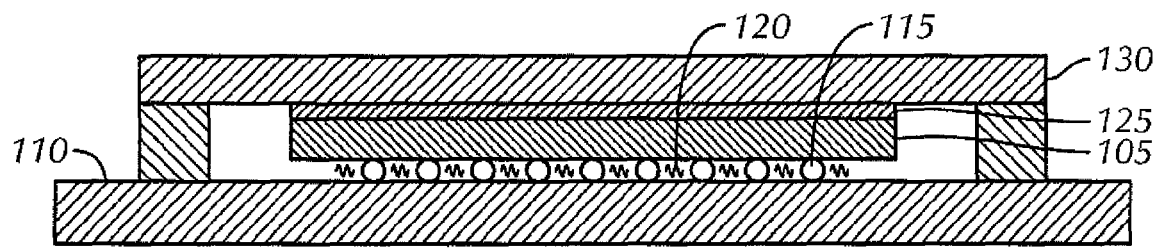

FIG. 2(c) shows an assembled semiconductor package in accordance with one or more embodiments of the present invention. The flattened out flip-chip die 105 is die-attached to the substrate 110 by die interconnect 115 through the reflow process. The underfill 120 is flooded between the die 105, the substrate 110, and the die-attach interconnect 115. A lid-attach TIM 125 may be placed directly on the bottom side of the die 105 or the corresponding side of a lid 130. The die-attached substrate 110 and the lid 130 may be pressed together to achieve a desired BLT of the lid-attach TIM 125. One of ordinary skill in the art will recognize that the BLT impacts the thermal resistance of the associated interface and the junction temperature when placed in system.

Figure 3:
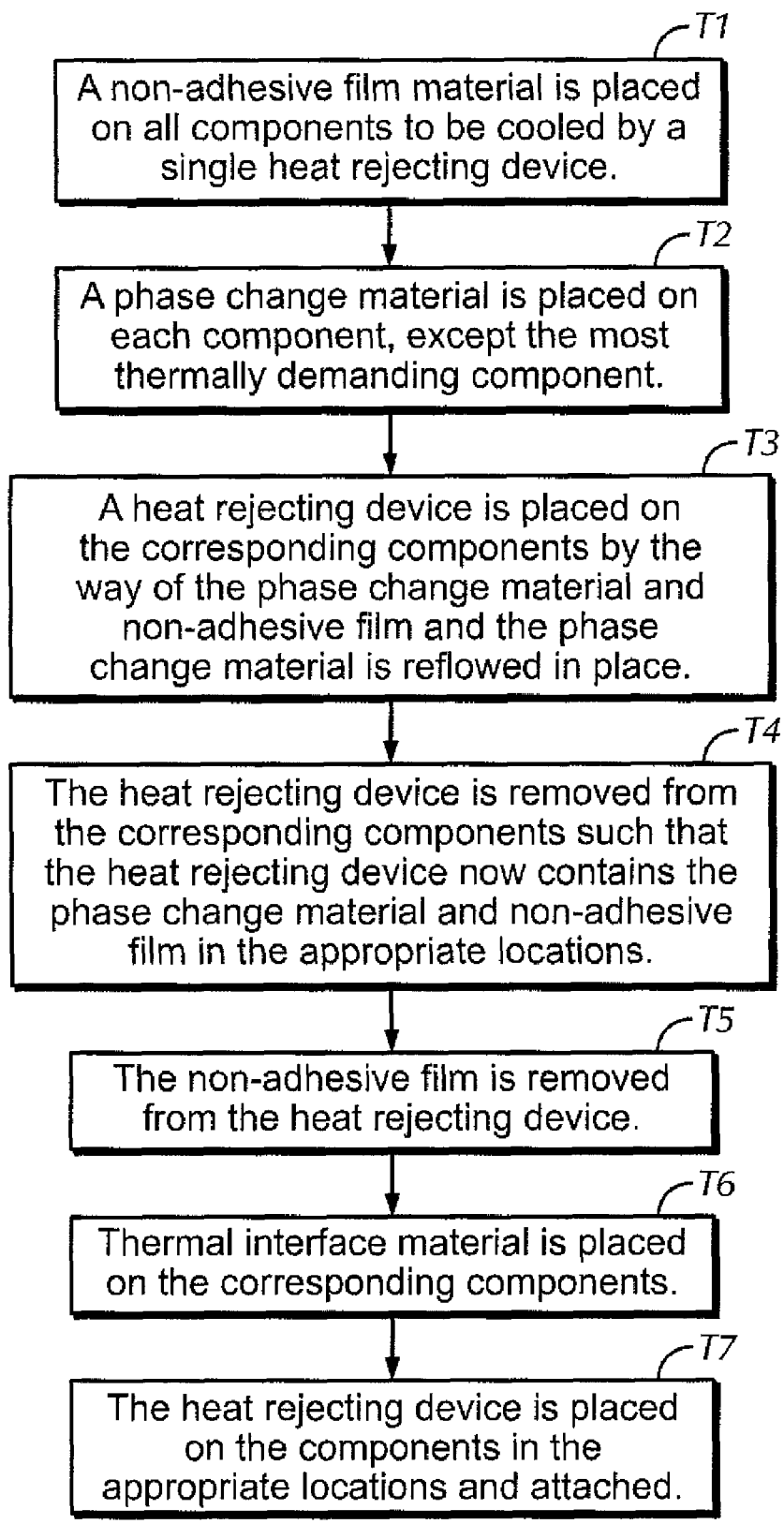
FIG. 3 is a process for implementing multi-surface compliant heat removal in accordance with one or more embodiments of the present invention.

FIG. 3 shows a process for implementing multi-surfaces compliant heat removal in accordance with one or more embodiments of the present invention. In T1, a non-adhesive film is placed on all components that are intended to be cooled by a single heat rejecting device. In T2, a phase change material ("PCM") is placed on each component other than the most thermally demanding component. In T3, a heat rejecting device is placed on the corresponding components in the appropriate locations by way of the PCM or non-adhesive film and the PCM is reflowed in place. In T4, the heat rejecting device is removed from the corresponding components such that the heat rejecting device is attached to the PCM and the non-adhesive film. In T5, the non-adhesive film is removed from the heat rejecting device. In T6, the heatsink-attach TIM is placed on the corresponding components. In T7, the heat rejecting device is placed on the corresponding components in the appropriate locations and attached.

Figure 4A:
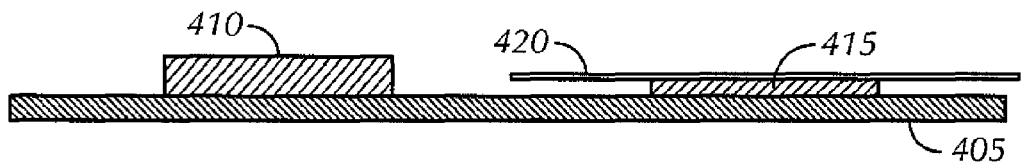
FIG. 4($a$) is a substrate with a primary component, a secondary component, and non-adhesive film placed on the primary and secondary component in accordance with one or more embodiments of the present invention.

FIG. 4(a) shows a substrate 405 with a primary component 410, a secondary component 415, and non-adhesive film 420 in accordance with one or more embodiments of the present invention. Substrate 405 may be the substrate of a semiconductor package or a PCB. The primary component 410 and secondary component 415 may differ in height, shape, size, or construction. A non-adhesive film 420 is placed on the primary component 410 and the secondary component 415.

Figure 4B:
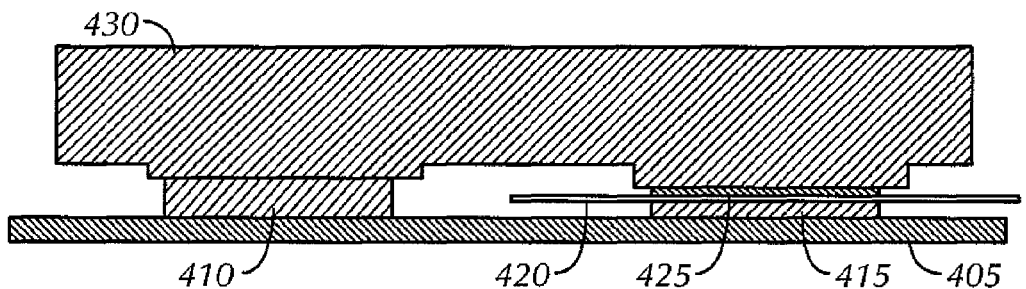

FIG. 4(b) shows the substrate 405, primary component 410, secondary component 415, non-adhesive film 420, PCM 425, and placed heat rejecting device 430 in accordance with one or more embodiments of the present invention. The primary component 410 is the most thermally demanding component. Accordingly, PCM 425 is placed on the secondary component 415. The heat rejecting device 430 is placed making contact with the primary component 410 by way of non-adhesive film 420 and making contact with the secondary component 415 by way of the PCM 425 and non-adhesive film 420. The PCM 425 is reflowed in place.

Figure 4C:
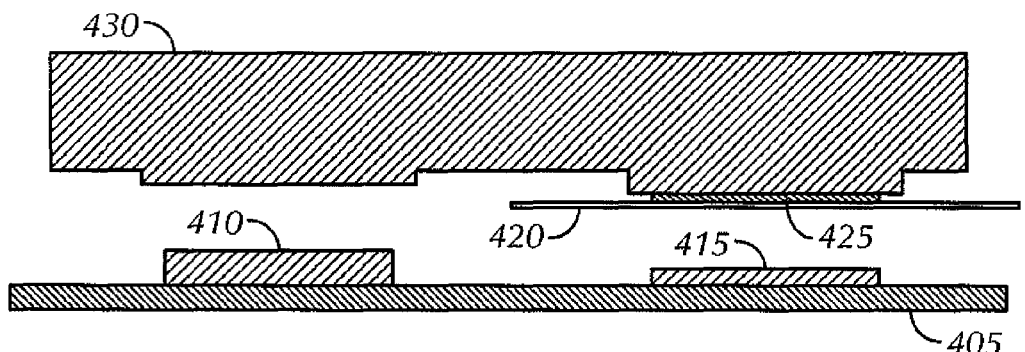

FIG. 4(c) shows the substrate 405 with the primary component 410 and secondary component 415, and removed heat rejecting device 430, PCM 425, and non-adhesive film 420 in accordance with one or more embodiments of the present invention. Heat rejecting device 430 is removed from the primary component 410 and secondary component 415 such that the heat rejecting device 430 now contains the PCM 425 and non-adhesive film 420.

Figure 4D:
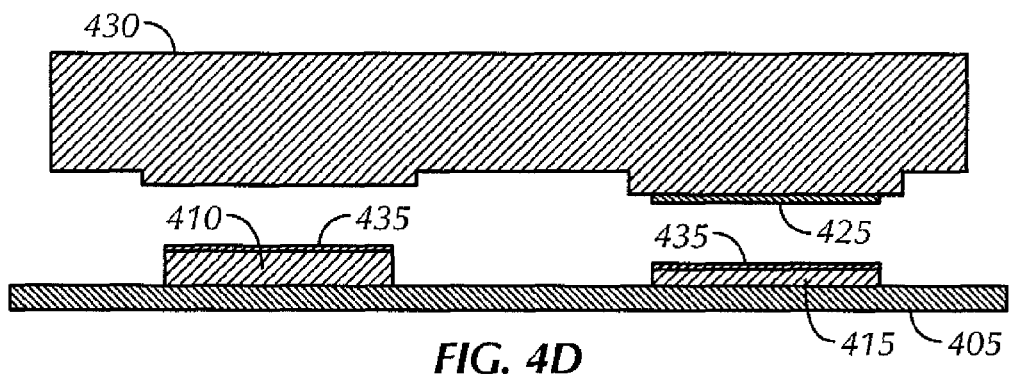

FIG. 4(d) is the substrate 405 with the primary component 410, secondary component 415, and heatsink attach-TIM 435, and removed heat rejecting device 430 and reflowed PCM 425 in accordance with one or more embodiments of the present invention. The non-adhesive film 420 is removed from the heat rejecting device 430 leaving the reflowed PCM 425 in place. Heatsink-attach TIM 435 is placed on the primary component 410 and the secondary component 415.

Figure 4E:
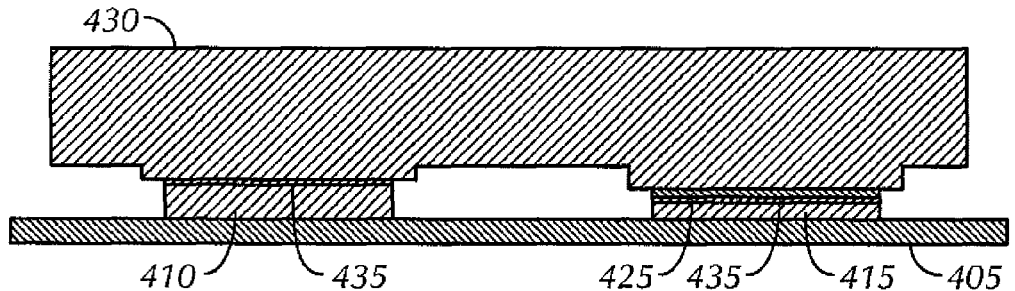

FIG. 4(e) shows the substrate 405, primary component 410, secondary component 415, reflowed PCM 425, re-placed heat rejecting device 430, and heatsink-attach TIM 435 in accordance with one or more embodiments of the present invention. The heat rejecting device 430 is placed on the primary component 410 and the secondary component 415 by way of the heatsink-attach TIM 435 and is attached. One of ordinary skill in the art will recognize that there are a variety of ways in which the heat rejecting device 430 may be attached to the substrate 405 in accordance with one or more embodiments of the present invention.

One of ordinary skill in the art will recognize that the present invention contemplates other configurations of components, semiconductor packages, and PCBs in accordance with one or more embodiments of the present invention.

Advantages of one or more embodiments of the present invention may include one or more of the following.

In one or more embodiments of the present invention, the semiconductor package assembly process results in a die that is flat or more nearly flat that eliminates or minimizes the void between the die, lid-attach TIM, and lid.

In one or more embodiments of the present invention, the semiconductor package assembly process results in a more controlled BLT of the lid-attach TIM.

In one or more embodiments of the present invention, the semiconductor package assembly process results in a decrease in the thermal resistance and lowers the junction temperature.

In one or more embodiments of the present invention, the multi-surface compliant heat removal process allows for the placement of a single heat rejecting device that spans a plurality of components.

In one or more embodiments of the present invention, the multi-surface compliant heat removal process accommodates components that vary in height due to design, assembly, or tolerance.

In one or more embodiments of the present invention, the multi-surface compliant heat removal process results in a more controlled BLT of the heatsink-attach TIM for all components under a single heat rejecting device.

In one or more embodiments of the present invention, the multi-surface compliant heat removal process results in a decrease in the thermal resistance and lowers the junction temperature for all components under a single beat rejecting device.

In one or more embodiments of the present invention, the multi-surface compliant heat removal process allows for design simplification, such as smaller and cost-reduced heat rejecting device implementations.

In one or more embodiments of the present invention, the multi-surface compliant heat removal process allows for lower fan speeds in systems utilizing heat rejecting devices with active cooling.

In one or more embodiments of the present invention, the multi-surface compliant heat removal process allows for reduced power consumption for system cooling.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A semiconductor package assembly process comprising:
   attaching one or more die to a substrate by a die-attach interconnect;
   raising a temperature of the one or more die to a target temperature;
   placing a lid-attach thermal interface material on the one or more die upon reaching the target temperature;
   placing a lid on the substrate to achieve a target bond line thickness of the lid-attach thermal interface material between the one or more die and the lid; and
   curing the assembled semiconductor package at a curing temperature.

2. The semiconductor package assembly process of claim 1, further comprising:
   reflowing the die-attach interconnect.

3. The semiconductor package assembly process of claim 1, further comprising:
   flooding the die-attach interconnect with an underfill material.

4. The semiconductor package assembly process of claim 1, wherein the curing temperature is the same as the target temperature.

5. The semiconductor package assembly process of claim 1, wherein one or more die exhibit warpage after being attached to the substrate.

6. The semiconductor package assembly process of claim 4, wherein the target temperature is sufficient to cause the one or more die to become substantially flat.

7. The semiconductor package assembly process of claim 4, wherein a target bond line thickness of the lid-attach thermal interface material is controlled by the compression of the die and the lid.

* * * * *